United States Patent
Peng et al.

(10) Patent No.: US 9,773,834 B2
(45) Date of Patent: Sep. 26, 2017

(54) METHOD FOR REDUCING CROSSTALK IN CMOS IMAGE SENSOR

(71) Applicant: SEMICONDUCTOR MANUFACTURING INTERNATIONAL (SHANGHAI) CORPORATION, Shanghai (CN)

(72) Inventors: Wenjie Peng, Shanghai (CN); Minwei Xi, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/339,598

(22) Filed: Oct. 31, 2016

(65) Prior Publication Data

US 2017/0047373 A1   Feb. 16, 2017

Related U.S. Application Data (62) Division of application No. 14/663,813, filed on Mar. 20, 2015, now Pat. No. 9,530,814.

(30) Foreign Application Priority Data

May 4, 2014 (CN) .......................... 2014 1 0184909

(51) Int. Cl.
*H01L 21/00* (2006.01)
*H01L 27/146* (2006.01)
*H01L 21/762* (2006.01)

(52) U.S. Cl.
CPC .. *H01L 27/14643* (2013.01); *H01L 21/76224* (2013.01); *H01L 27/1463* (2013.01); *H01L 27/1464* (2013.01); *H01L 27/14683* (2013.01); *H01L 27/14689* (2013.01)

(58) Field of Classification Search
None
See application file for complete search history.

(56) References Cited

U.S. PATENT DOCUMENTS

| | | | | |
|---|---|---|---|---|
| 6,303,464 B1 * | 10/2001 | Gaw | ................... | H01L 21/7682 257/758 |
| 2006/0046409 A1 * | 3/2006 | Fujimaki | ................. | H01L 21/84 438/309 |
| 2012/0025199 A1 * | 2/2012 | Chen | ................... | H01L 27/1464 257/75 |

* cited by examiner

*Primary Examiner* — Reema Patel
(74) *Attorney, Agent, or Firm* — Kilpatrick Townsend & Stockton LLP (57) ABSTRACT

A method of manufacturing a CMOS image sensor includes providing a semiconductor substrate having a front side and a back side, forming at least two pixels in the front side, forming a shallow trench isolation in the front side between the at least two pixels, forming a deep trench in the back side at a location above the shallow trench isolation, and depositing a dielectric layer in the deep trench to form a crosstalk reduction element.

13 Claims, 8 Drawing Sheets

METHOD FOR REDUCING CROSSTALK IN CMOS IMAGE SENSOR

CROSS-REFERENCES TO RELATED APPLICATIONS

This application is a divisional application of U.S. patent application Ser. No. 14/663,813, filed on Mar. 20, 2015, now U.S. Pat. No. 9,530,814 B2, which claims priority to Chinese patent application No. 201410184909.7, entitled "METHOD AND APPARATUS FOR REDUCING CROSSTALK IN CMOS IMAGE SENSOR", filed on May 4, 2014, the contents of which are incorporated herein by reference in their entirety.

BACKGROUND OF THE INVENTION

The present invention relates to semiconductor technology, and more particularly to a CMOS image sensor, a method for manufacturing the same, and an electronic device including a CMOS image sensor.

An image sensor is a semiconductor device that is capable to convert an optical image into an electric signal. There are two main types of image sensors such as charge-coupled devices (CCD) and complementary metal oxide semiconductor (CMOS) image sensors. CCD image sensors have the advantages of higher image sensitivity and low noise, but CCD image sensors are difficult to be integrated with other devices and have high power consumption for large arrays. In contrast, CMOS image sensors have a simple manufacture process and can be easily integrated with other devices to achieve a higher level of integration. Furthermore, CMOS image sensors have a smaller size, lightweight, lower power consumption, and low cost. CMOS image sensors are currently widely used in digital still cameras, digital video cameras, camera phones, medical imaging devices (e.g., gastroscopy), rear viewing cameras and monitor systems for motor vehicles.

Figure 1:
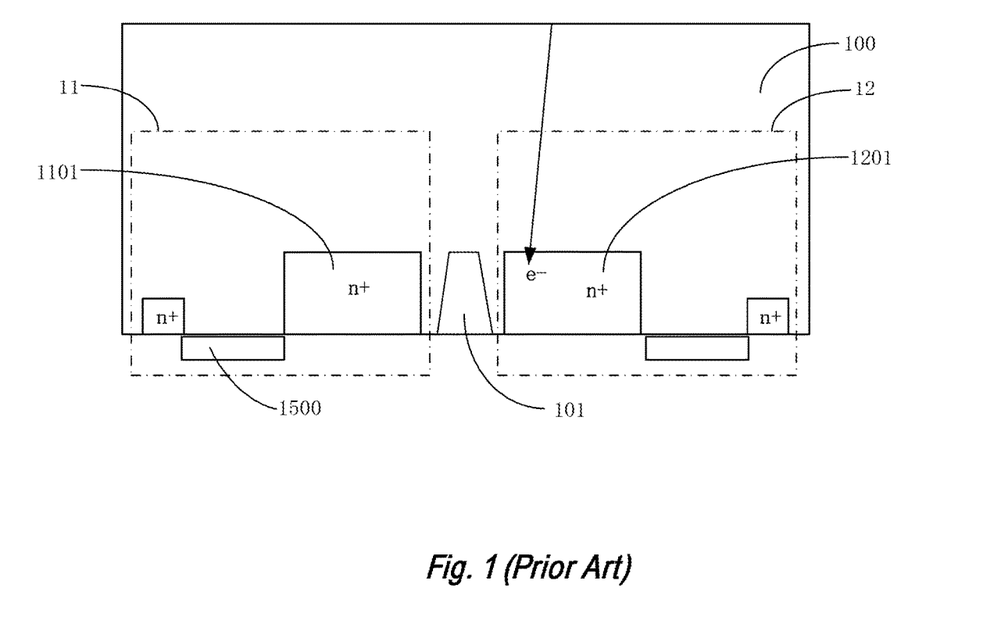
FIG. 1 is a simplified cross-sectional view of a portion of a conventional CMOS image sensor.

A conventional CMOS image sensor includes a semiconductor substrate, multiple pixels arranged in an array configuration in the semiconductor substrate, and shallow trench isolations (STI) disposed between adjacent pixels. FIG. 1 is simplified cross-sectional view of a conventional backside illuminated CMOS image sensor. The CMOS image sensor includes a semiconductor substrate 100, multiple pixels (two pixels 11 and 12 are shown), and multiple shallow trench isolations (STI) disposed between two adjacent pixels (a STI 101 is shown between pixels 11 and 12). The CMOS image sensor further includes a semiconductor layer comprising multiple active elements (transistors) and passive elements such as resistors, capacitors, and others. The semiconductor layer is shown as a polysilicon layer 1500. The CMOS image sensor also includes transistors and photodiodes for converting photons into electrical signals, which are amplified by the transistors and provided to other electronic devices for processing. The shallow trench isolations are used to isolate adjacent pixels. Incident light from the back surface of the semiconductor substrate reaches the photodiode of pixel 12 (indicted as an arrow), the photodiode captures incident photons and converts them into photoelectrons (indicated as "e–"), which are collected in the n+ layer of the photodiode. Since incident light is entered from the back surface of the semiconductor substrate to the pixels, this type of CMOS image sensors is generally referred to as backside-illuminated CMOS image sensors.

Figure 2:
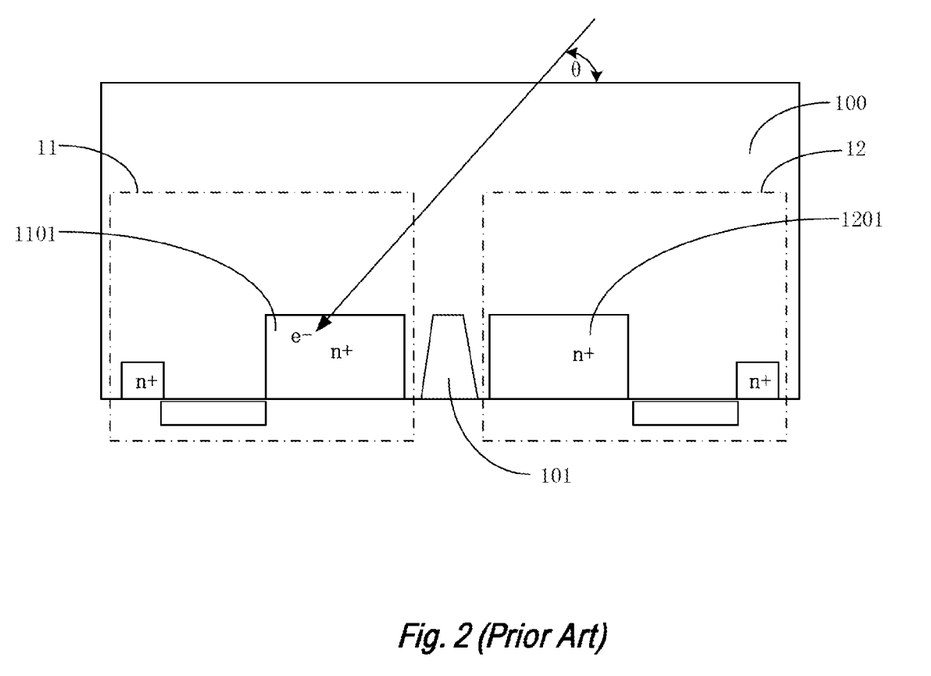
FIG. 2 is a simplified cross-sectional view describing a principle of optical crosstalk.
Figure 3:
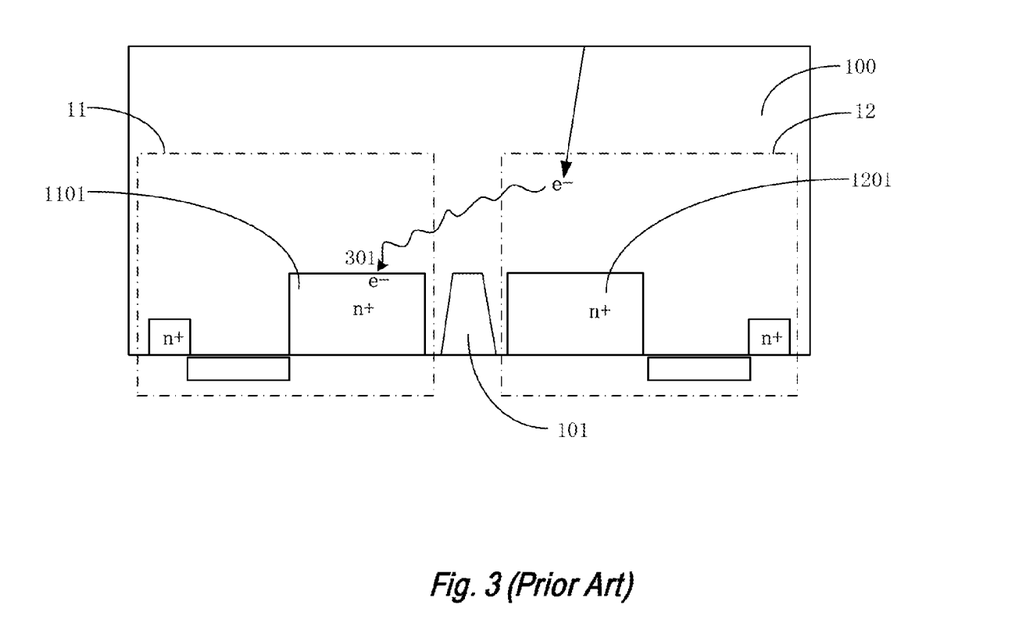
FIG. 3 is a simplified cross-sectional view describing a principle of electrical crosstalk.

In the prior art, a backside-illuminated CMOS image sensor has two sources of crosstalk: one crosstalk source is optical crosstalk, and the other crosstalk source is electrical crosstalk. Optical crosstalk is mainly caused by incident light having large incident angles θ into adjacent photodiodes, as shown in FIG. 2. Electrical crosstalk is mainly caused by photoelectrons 301 wandering into adjacent photodiodes, as shown in FIG. 3. Both sources of crosstalk can affect the image quality of a CMOS image sensor, namely, the greater the crosstalk, the worse the quality of the final image.

Therefore, a new solution is needed to reduce crosstalk in the CMOS image sensors.

BRIEF SUMMARY OF THE INVENTION

Embodiments of the present invention relate to semiconductor technology, and more particularly to a CMOS image sensor, a method for manufacturing the same, and an electronic device including the CMOS image sensor.

According to one embodiment of the present invention, a CMOS image sensor includes a semiconductor substrate having a front side and a back side, at least two pixels disposed in the front side, a shallow trench isolation disposed in the front side between the at least two pixels, and a crosstalk reduction element disposed in the back side at a location above the shallow trench isolation.

In one embodiment, the crosstalk reduction element is a deep trench isolation comprising a cavity. The crosstalk reduction element includes a bottom portion in contact with a top portion of the shallow trench isolation, and a top portion having a surface coplanar with a back side surface of the semiconductor device. In an embodiment, the crosstalk reduction element includes tetraethyl orthosilicate (TEOS).

In an embodiment, the crosstalk reduction element has a depth in a range between 1.5 um and 4 um and a width equal to or less than 0.25 um.

In an embodiment, each of the at least two pixels includes a photodiode. The photodiode includes an n+ layer In another embodiment, a method for manufacturing a CMOS image sensor includes providing a semiconductor substrate having a front side and a back side, forming at least two pixels in the front side, forming a shallow trench isolation in the front side between the at least two pixels, forming a deep trench in the back side at a location above the shallow trench isolation, and depositing a dielectric layer in the deep trench to form a crosstalk reduction element.

In an embodiment, the deep trench is a high aspect ratio deep trench having a depth to width ratio of greater than about 5. In an embodiment, the deep trench has a depth in a range between 1.5 um and 4 um and a width equal to or less than 0.25 um.

In yet another embodiment, an electronic device includes the above-described CMOS image sensor.

The following description, together with the accompanying drawings, will provide a better understanding of the nature and advantages of the claimed invention.

BRIEF DESCRIPTION OF THE DRAWINGS

The accompanying drawings, which are incorporated in and constitute a part of the specification, illustrate embodiments of the present invention. The like reference labels in various drawings refer to the like elements.

DETAILED DESCRIPTION OF THE INVENTION

The present invention will be understood more fully from the detailed description given below and from the accompanying drawings of the preferred embodiments of the invention, which, however, should not be taken to limit the invention to the specific embodiments, but are for explanation and understanding only.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The use of the terms first, second, etc. do not denote any order, but rather the terms first, second, etc. are used to distinguish one element from another. Furthermore, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

The term "semiconductor substrate" may include silicon-germanium, silicon-on-insulator (SOI) or silicon-on-sapphire (SOS) technology, doped and undoped semiconductors, epitaxial layers of silicon supported by a base semiconductor foundation, and other semiconductor structures.

The term "pixel" refers to a discrete picture element unit cell containing a photodiode and one or more transistors for converting incident light to an electrical signal.

Embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention. In the drawings, like reference numbers designate like elements.

Embodiment 1

The present invention is directed to a CMOS image sensor having reduced crosstalk, including optical crosstalk and electrical crosstalk, thereby improving the image quality of the CMOS image sensor.

Figure 4:
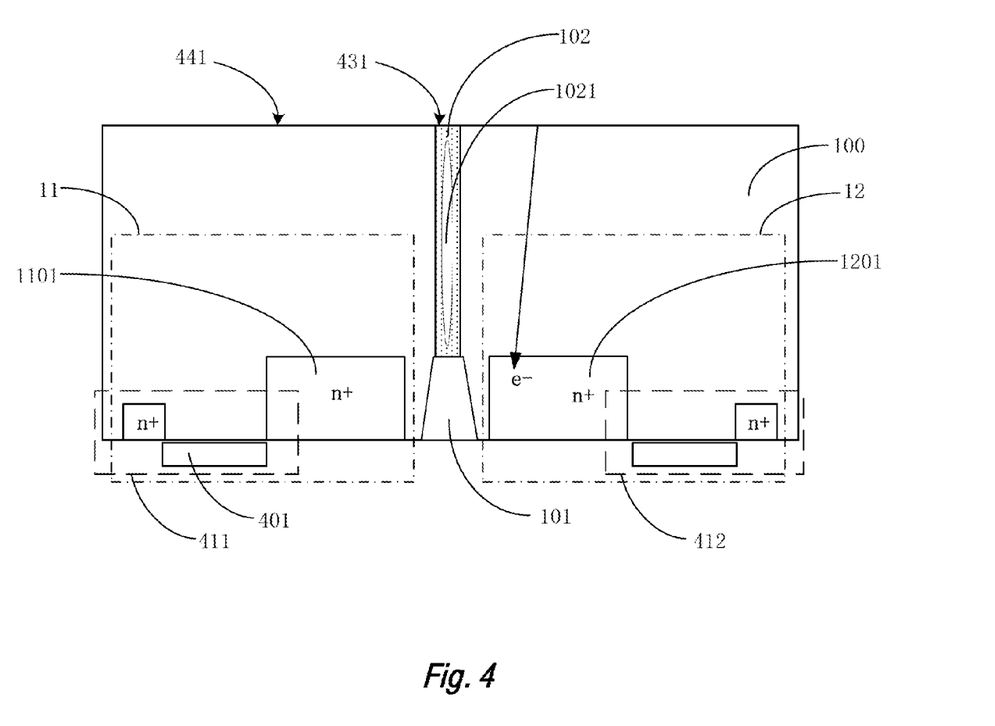
FIG. 4 is a simplified cross-sectional view of a portion of a CMOS image sensor according to an embodiment of the present invention.

The CMOS image sensor will be described with reference to FIG. 4 through FIG. 7. FIG. 4 is a simplified cross-sectional view of a portion of a CMOS image sensor according to an embodiment of the present invention. FIG.

Figure 5:
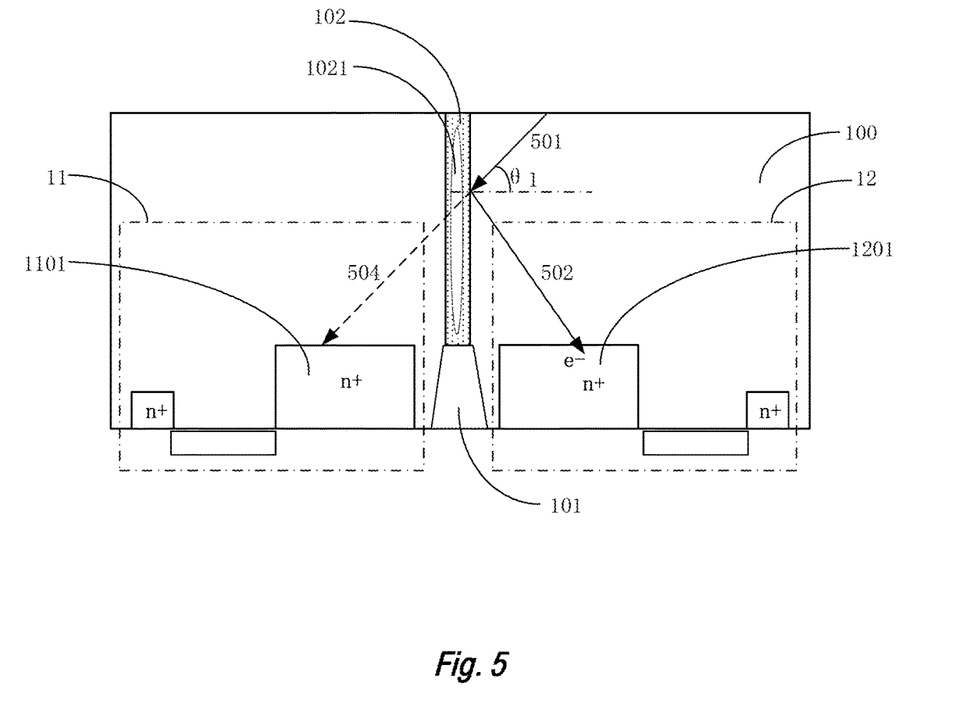
FIG. 5 is a simplified cross-sectional view of a portion of a CMOS image sensor for reducing optical crosstalk according to an embodiment of the present invention.
Figures 6A, 6B:
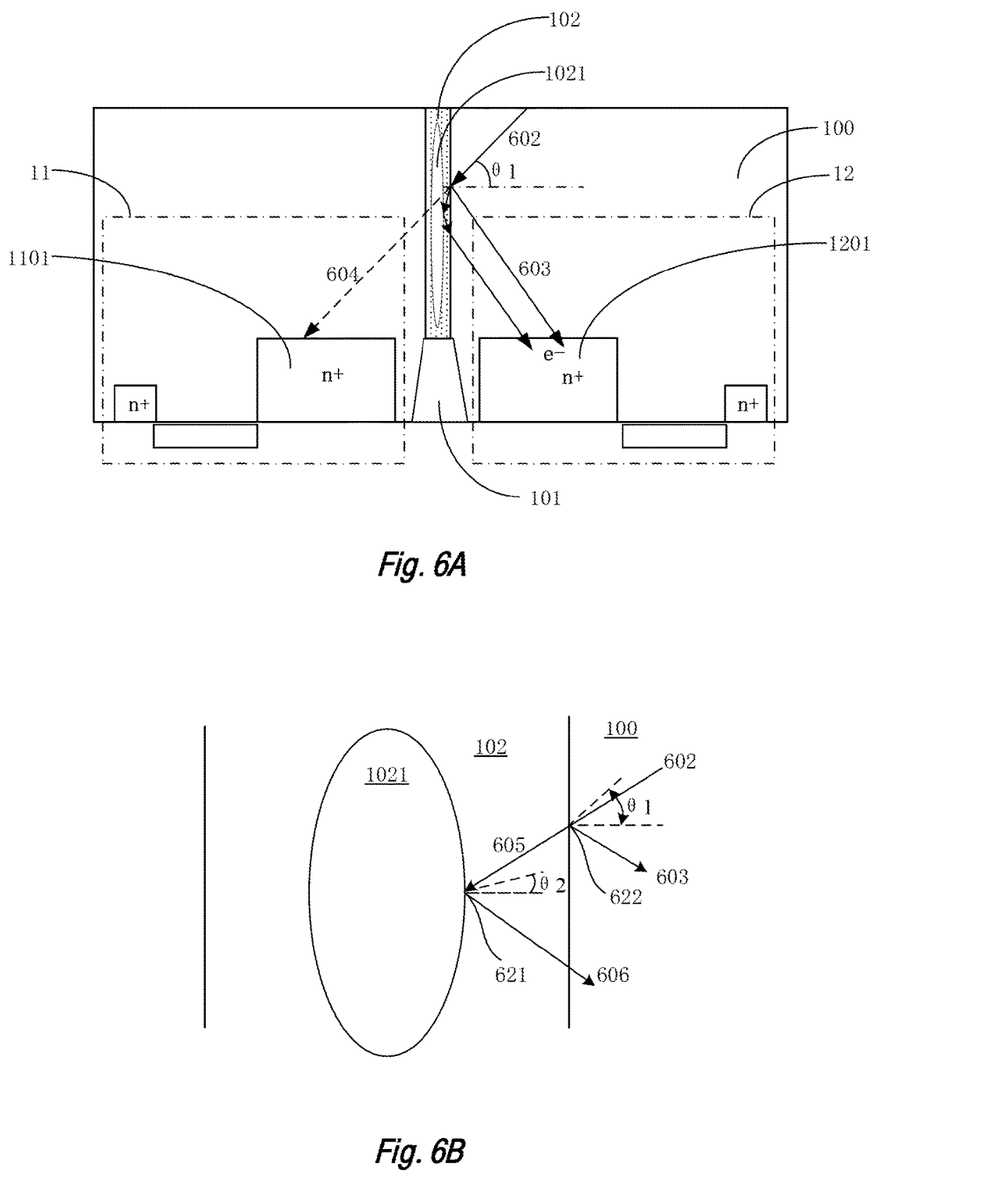
FIG. 6A is a simplified cross-sectional view of a portion of a CMOS image sensor for reducing optical crosstalk according to another embodiment of the present invention.
FIG. 6B is a cross-sectional view of an enlarged portion of FIG. 6A.
Figure 7:
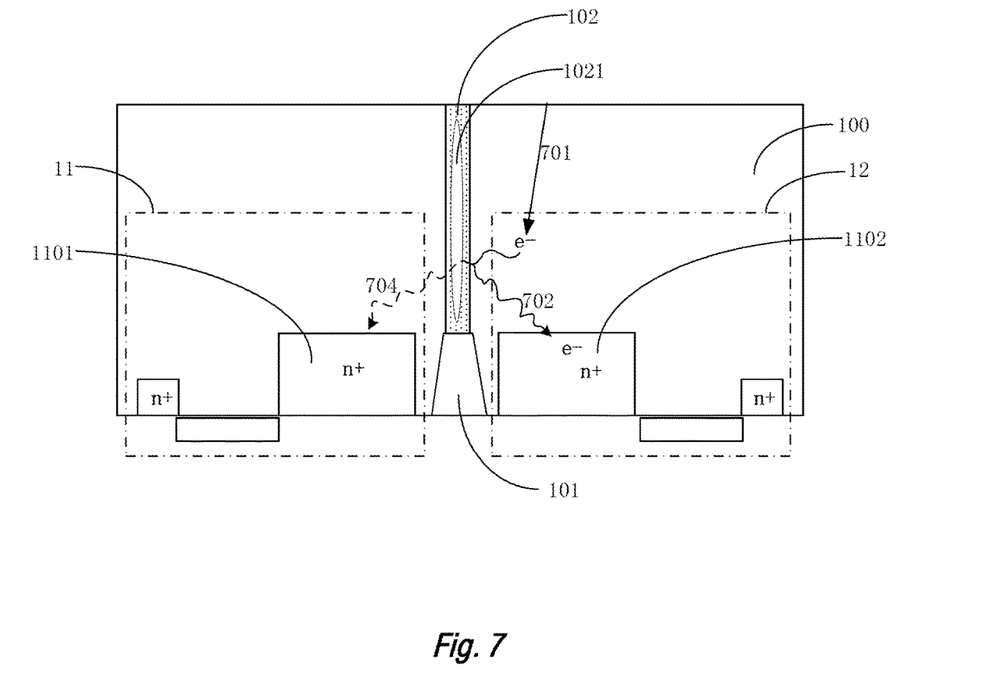
FIG. 7 is a simplified cross-sectional view of a portion of a CMOS image sensor for reducing electrical crosstalk according to an embodiment of the present invention.

5 is a simplified cross-sectional view of a portion of a CMOS image sensor for reducing optical crosstalk (or photic crosstalk) according to an embodiment of the present invention. FIG. 6 is a simplified cross-sectional view of a portion of a CMOS image sensor for reducing optical crosstalk (photic crosstalk) according to another embodiment of the present invention. FIG. 7 is a simplified cross-sectional view of a portion of a CMOS image sensor for reducing electrical crosstalk according to an embodiment of the present invention.

Referring to FIG. 4, a CMOS image sensor according to an embodiment may include a semiconductor substrate 100 having a front side and a back side, a plurality of pixels arranged in an array configuration and disposed in the front side, and a plurality of shallow trench isolations each disposed between two adjacent pixels. The CMOS image sensor may also include a semiconductor layer comprising a plurality of transistors and other components such as resistors, capacitors, and others. The semiconductor layer is denoted as a polysilicon layer 401 in FIG. 4. For purposes of clarity, only two pixels (a first pixel 11 and a second pixel 12) are shown in FIG. 4 through FIG. 7. As shown, a shallow trench isolation (STI) 101 is disposed between first pixel 11 and second pixel 12. STI 101 is configured to isolate adjacent pixels 11 and 12 from each other and is generally disposed in the front side of the semiconductor substrate. The front side is the side that the semiconductor layer 401 (comprising electronic devices such as transistors, resistors, diodes, capacitors, inductors, etc.) is disposed on. The front side is shown as the bottom side in FIG. 4.

Each of pixels (e.g., pixels 11, 12) includes a photodiode (1101, 1201) and at least one transistor (indicated as dotted rectangles 411, 412). The photodiode may be fabricated using conventional techniques and is configured to convert the photons into electrical signals that are then amplified and transferred by the transistor for further processing. Incident light (indicated by an arrow in FIG. 4) enters from the back side (opposite of the front side) of the semiconductor substrate to reach the pixels (e.g., second pixel 12). The photodiode (1201) captures the incident photons to produce photoelectrons (denoted as "e−"), which are then collected (accumulated) in the n+ layer of the photodiode. Because incident light enters from the backside of the semiconductor substrate, the CMOS image sensor is referred to as a backside-illuminated CMOS image sensor.

Different from the conventional art, the CMOS image sensor according to the present invention further comprises a crosstalk reduction element 102 disposed above the STI 101, as shown in FIG. 4. Crosstalk reduction element 102 can reduce optical crosstalk and electrical crosstalk.

In an embodiment, crosstalk reduction element 102 is a deep trench isolation. In a specific embodiment, crosstalk reduction element 102 may include a cavity (void) 1021 to further improve crosstalk. In an embodiment, cavity or void 1021 may be a vacuum or near vacuum structure. In another embodiment, cavity 1021 may be a structure containing a gas. In yet another embodiment, cavity 1021 may include one or more cavities (voids). As used herein, a groove or space within the deep trench isolation (i.e., crosstalk reduction element) is referred to as a void or a cavity. Although a void or cavity is described in a singular form, a void or cavity can comprise one or more grooves, voids, or cavities disposed partially in the crosstalk reduction element or entirely within the crosstalk reduction element. It is appreciated that, although cavity or void 1021 is shown as having a regular oval structure, it is understood that the cavity or void 1021 can have one or more voids having any regular or irregular shape or form. The one or more voids or cavities can be separated from each other or connected to each other.

In an embodiment, crosstalk reduction element 102 has a bottom portion in contact with the top portion of the shallow trench isolation 101, and the top surface 431 of crosstalk reduction element 102 is coplanar with the backside (top side) surface 441 of the semiconductor substrate. This configuration can reduce optical crosstalk and electrical crosstalk to the maximum extent.

In an embodiment, the deep trench has a bottom in contact with the bottom surface of the STI. In an embodiment, the deep trench has a ratio of depth/width (or height/width) greater than about 5. In a specific embodiment, crosstalk reduction element 102 has a depth in the range between 1.5 um and 4 um and a width in the range equal to or less than 0.25 um.

In an embodiment, crosstalk reduction element 102 is a deep trench filled with a dielectric layer. In an embodiment, the dielectric layer is deposited as a sub-atmospheric tetraethyl orthosilicate (SATEOS). Crosstalk reduction element 102 can be formed by forming a deep trench in the back side of semiconductor substrate 100, and depositing a dielectric material (e.g., sub-atmospheric tetraethyl orthosilicate) in the deep trench. Details of forming crosstalk reduction element 102 will be further described in detail below.

The interface between the cavity 1021 and crosstalk reduction element 102 and the interface between crosstalk reduction element 102 and the semiconductor substrate 100 generate a total internal reflection. Incident light straying away from a target pixel and reaching the interfaces will be reflected back to the target pixel (specifically to the photodiode 1201 of the target pixel), optical crosstalk of the CMOS image sensor can thus be reduced or eliminated.

The principles of reducing optical crosstalk and electrical crosstalk will be explained with reference to FIGS. 5-7. For optical crosstalk, when the incident angle of incident light is greater than the angle θ1 of the total internal reflection (TIR) at the interface between the crosstalk reduction element 102 and the semiconductor substrate 100, a total internal reflection will occur, and the reflected light will reach a target photodiode 1201, thereby reducing optical crosstalk. In an embodiment, the TIR angle of incidence between the crosstalk reduction element 102 and the semiconductor substrate 100 is about 26 degrees. Referring to FIG. 5, incident light is indicated by a solid arrow 501, reflected light is indicated by a solid arrow 502, optical crosstalk is indicated by a dotted arrow 504 when there is no crosstalk reduction element 102.

In the case of optical crosstalk, when the incident angle of incident light is smaller than the TIR angle θ1 between the crosstalk reduction element 102 and the semiconductor substrate 100 (about 26 degrees), but greater than a TIR angle θ2 between the crosstalk reduction element 102 and the cavity 1021 (about 17 degrees), light that enters the crosstalk reduction element will be totally reflected at the interface 621 between the crosstalk element and the cavity. The totally reflected light at the interface 621 between the crosstalk reduction element 102 and the cavity 1021 and the partially reflected light between the interface 622 between the crosstalk reduction element and the semiconductor substrate will reach the target photodiode 1201, thereby reducing optical crosstalk.

FIG. 6A is a cross-sectional view of a portion of the CMOS image sensor illustrating the principle. FIG. 6B is a cross-sectional view of an enlarged portion of FIG. 6A. Referring to FIG. 6A, optical crosstalk is indicated by a dotted arrow 604 when there is no crosstalk reduction element 102. Referring to FIG. 6B, incident light entering semiconductor substrate 100 and reaching interface 622 is indicated by a solid arrow 602, a partially reflected light at the interface 622 between the crosstalk reduction element 102 and the semiconductor substrate is indicated by a solid arrow 603, a portion of incident light 602 that partially enters the crosstalk reduction element 102 is indicated by a solid arrow 605, a totally reflected light at the interface 621 between the crosstalk element and the cavity is indicated by a solid arrow 606.

Thus, due to the presence of the crosstalk reduction element 102, optical crosstalk can be reduced in the CMOS image sensor to a greater extent. Obviously, if the cavity (void) 1021 is not present in the crosstalk reduction element 102, optical crosstalk can also be reduced in the CMOS image sensor to some degrees.

In the case of electrical crosstalk, the crosstalk reduction element 102 may isolate photoelectrons (shown as "e−" in the Figures) and prevent photoelectrons from entering into other photodiodes other than the target photodiode 1102. Referring to FIG. 7, incident light is indicated by a solid arrow 701, the generated photoelectron is indicated by a solid curved arrow 702, electrical crosstalk is indicated by a dotted curved arrow 704 when there is no crosstalk reduction element 102. As can be seen, the presence of the crosstalk reduction element 102 may reduce electrical crosstalk in the CMOS image sensor to some extent.

In accordance with the present invention, a CMOS image sensor comprises a crosstalk reduction element that is disposed above a shallow trench isolation within the semiconductor substrate. The shallow trench isolation is disposed between two adjacent pixels. The crosstalk reduction element can reduce optical crosstalk and electrical crosstalk, thereby improving the image quality of the CMOS image sensor.

Embodiment 2

Figure 8:
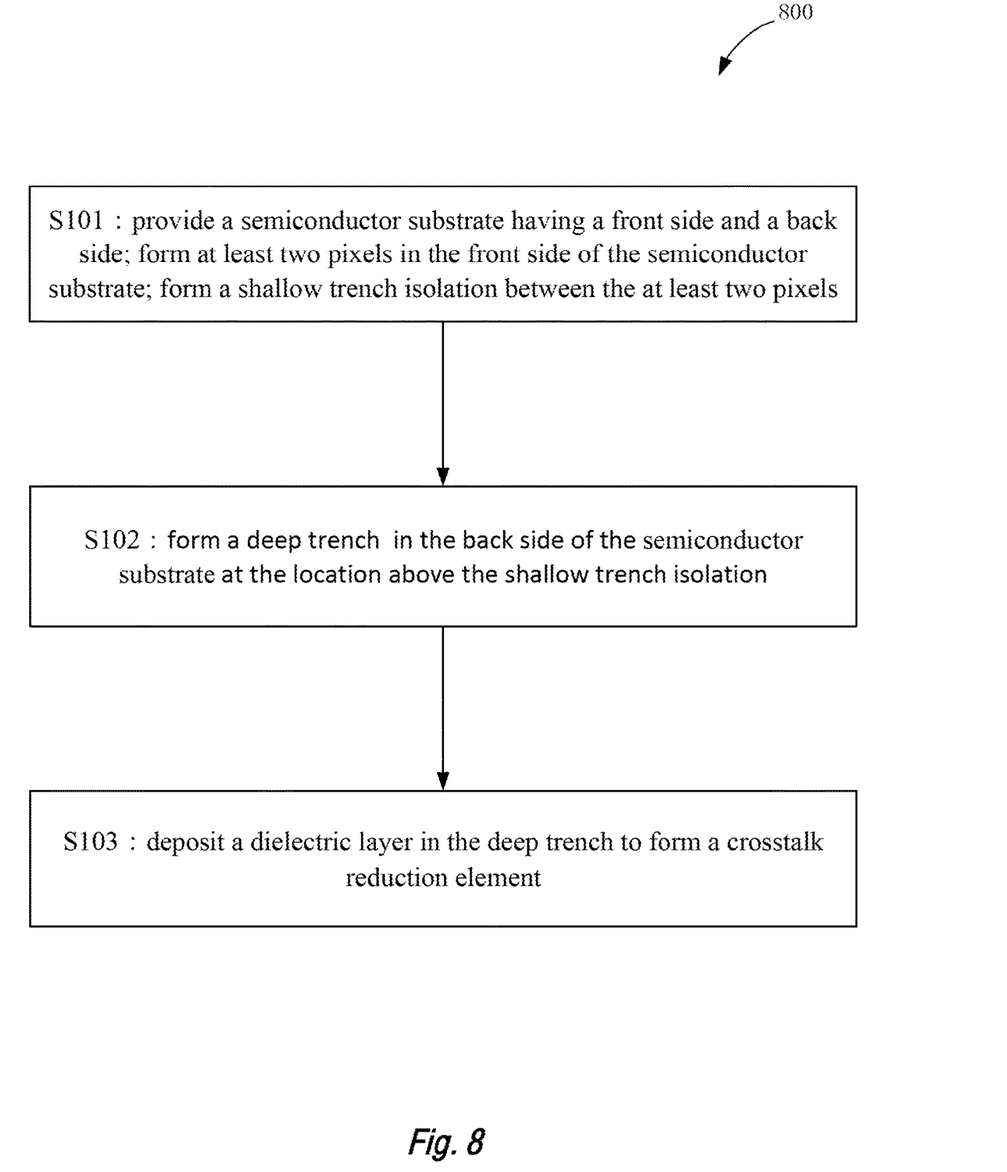
FIG. 8 is a simplified flowchart of a method for manufacturing a CMOS image sensor according to an embodiment of the present invention.

The present invention is directed to a method for manufacturing a CMOS image sensor. FIG. 8 a simplified flowchart of a method 800 for manufacturing a CMOS image sensor according to an embodiment of the present invention. Method 800 includes the following steps:

S101: provide a semiconductor substrate having a front side and a back side; form at least two pixels in the front side of the semiconductor substrate; and form a shallow trench isolation (STI) in the front side between the at least two adjacent pixels.

The pixels and the STI are formed in the front side of the semiconductor substrate. Each pixel includes a photodiode and a transistor. The photodiode includes an n+ layer and may be fabricated using conventional techniques.

S102: form a deep trench in the back side of the semiconductor substrate. The back side is opposite the first side. The deep trench is formed at a location above the STI. The deep trench can be formed by forming a mask layer over the surface of the back side, forming an opening at the location above the shallow trench isolation, and etching the semiconductor substrate through the opening of the mask layer. The etch process can be dry etching, wet etching, or dry etching in combination with wet etching.

In an embodiment, the deep trench has a depth/width ratio of greater than about 5. In a specific embodiment, the depth of the deep trench is in the range between 1.5 microns (um) and 4 um, and the width of the deep trench is equal to or less than 0.25 um.

In an embodiment, the deep trench is etched until a surface of the shallow trench isolation is exposed. In other words, the deep trench has a bottom portion in contact with a top portion of the STI.

S103: deposit a dielectric layer in the deep trench to form a crosstalk reduction element.

In an embodiment, the dielectric layer is of sub-atmospheric tetraethyl orthosilicate (SATEOS) or other suitable materials. Due to the high aspect ratio of the deep trench (Ratio depth/width is greater than 5), or more cavities (voids) may be formed while the dielectric layer is deposited in the deep trench. The dielectric layer is filled at least to cover the top of the deep trench. Thereafter, a chemical mechanical polishing process in performed so that the surface of the dielectric layer is coplanar with the planar surface of the back side of the semiconductor substrate.

In accordance with the present invention, the method for manufacturing a CMOS image sensor includes forming a shallow trench isolation in one side of the semiconductor substrate and forming a crosstalk reduction element in an opposite side of the semiconductor substrate above the shallow trench isolation. The crosstalk reduction element can reduce optical crosstalk and electrical crosstalk and improve the image quality of the CMOS image sensor.

Embodiment 3

Embodiments of the present invention also provide an electronic device. The electronic device may include a CMOS image sensor comprising the above-described crosstalk reduction element or a CMOS image sensor comprising a crosstalk reduction element made of a above-described method.

In a specific embodiment, the electronic device includes a CMOS image sensor. The CMOS image sensor comprises a semiconductor substrate having a front side and a back side, at least two pixels, and a shallow trench isolation disposed between the at least two pixels. The at least two pixels, and a shallow trench isolation disposed between the at least two pixels are disposed in the front side of the semiconductor substrate. The CMOS image sensor further comprises a crosstalk reduction element disposed in the back side of the semiconductor substrate at a location above the shallow trench isolation. The back side is opposite the front side.

In an embodiment, the crosstalk reduction element comprises a cavity (a void). In an embodiment, the cavity may be a vacuum or a near vacuum. In another embodiment, the vacuum may be filled with a gas. Due to the different refractive indices of the semiconductor substrate, the dielectric layer in the deep trench, and the cavity (void), the crosstalk reduction element has a first total internal reflection (TIR) angle at the interface between the crosstalk reduction element and the semiconductor substrate and a second TIR angle between the crosstalk reduction element 102 and the cavity 1021 within the crosstalk reduction element. In an embodiment, the first TIR angle is about 26 degrees, and the second TIR angle is about 17 degrees.

In some embodiments, the electronic device may be a mobile phone, a tablet computer, a laptop, a netbook, a game console, a TV receiver, a VCD, DVD players, a GPS device, a still image digital camera, a video camera, a voice recorder, a MP3, MP4 device, a PSP device, surveillance camera, other electronic products, or intermediate products that comprises the above-described CMOS image sensor, such as an integrated circuit board of a mobile phone.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. For example, although two pixels are used for the description, it is understood that the number of pixels can be hundreds thousands or more in other embodiments. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a CMOS image sensor, the method comprising:
   providing a semiconductor substrate having a front side and a back side;
   forming at least two pixels in the front side;
   forming a shallow trench isolation in the front side between the at least two pixels;
   forming a deep trench in the back side at a location above the shallow trench isolation; and
   depositing a dielectric layer in the deep trench having a cavity to form a crosstalk reduction element.

2. The method of claim 1, wherein the deep trench has a ratio of depth/width greater than 5.

3. The method of claim 1, wherein the deep trench has a depth in a range between 1.5 um and 4 um and a width equal to or less than 0.25 um.

4. The method of claim 1, wherein the crosstalk reduction element comprises:
   a bottom portion in contact with a top portion of the shallow trench isolation; and
   a top portion having a surface coplanar with a surface of the back side of the semiconductor device.

5. The method of claim 1, wherein forming the deep trench in the back side comprises:
   forming a mask layer on a surface of the back side;
   forming an opening in the mask layer at the location of the shallow trench isolation; and
   etching the semiconductor substrate through the opening until a surface of the shallow trench isolation is exposed.

6. The method of claim 1, wherein depositing the dielectric layer in the deep trench comprises performing a high-aspect ratio depositing process to form the cavity within the deep trench.

7. The method of claim 1, wherein the dielectric layer comprises sub-atmospheric tetraethyl orthosilicate (SA-TEOS).

8. The method of claim 1, wherein the at least two pixels each comprises a photodiode.

9. The method of claim 8, wherein the photodiode comprises an n+ layer.

10. The method of claim 1, wherein the cavity comprises a plurality of voids separated from each other.

11. The method of claim 1, wherein the cavity comprises a near-vacuum structure.

12. The method of claim 1, wherein the crosstalk reduction element comprises:
   a first interface between the semiconductor substrate and the deep trench isolation, the first interface comprising a first total internal reflection angle of about 26 degrees; and
   a second interface between the dielectric layer and the cavity, the second interface comprising a second total internal reflection angle of about 17 degrees.

13. The method of claim 1, further comprising:
   Performing a chemical mechanical polishing process on the dielectric layer so that a surface of the dielectric layer is flush with a planar surface of the back side of the semiconductor substrate.

* * * * *